(12) United States Patent
Hayashi et al.

(10) Patent No.: US 10,203,367 B2
(45) Date of Patent: Feb. 12, 2019

(54) QUALITY EVALUATION METHOD FOR LAMINATE HAVING PROTECTIVE LAYER ON SURFACE OF OXIDE SEMICONDUCTOR THIN FILM AND QUALITY CONTROL METHOD FOR OXIDE SEMICONDUCTOR THIN FILM

(71) Applicant: KOBE STEEL, LTD., Kobe-shi (JP)

(72) Inventors: Kazushi Hayashi, Kobe (JP); Aya Miki, Kobe (JP); Nobuyuki Kawakami, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

(21) Appl. No.: 15/316,801

(22) PCT Filed: Jun. 22, 2015

(86) PCT No.: PCT/JP2015/067848
§ 371 (c)(1),
(2) Date: Dec. 6, 2016

(87) PCT Pub. No.: WO2016/002554
PCT Pub. Date: Jan. 7, 2016

(65) Prior Publication Data
US 2017/0184660 A1 Jun. 29, 2017

(30) Foreign Application Priority Data
Jul. 1, 2014 (JP) .................... 2014-136349

(51) Int. Cl.
*G01R 31/26* (2014.01)
*G01R 31/265* (2006.01)
(Continued)

(52) U.S. Cl.
CPC .......... *G01R 31/2656* (2013.01); *G01R 1/06* (2013.01); *G01R 31/2623* (2013.01);
(Continued)

(58) Field of Classification Search
CPC .......... G01R 31/2635; G01R 19/16519; G01R 31/2621; G01R 31/2623; G01R 31/2625;
(Continued)

(56) References Cited

U.S. PATENT DOCUMENTS 8,981,374 B2 * 3/2015 Kubota ............. H01L 29/41733
257/43
2010/0276685 A1 11/2010 Itagaki et al.
(Continued)

FOREIGN PATENT DOCUMENTS

JP 2010-40552 A 2/2010
JP 2011-14761 A 1/2011
(Continued)

OTHER PUBLICATIONS

A. Hino, et al., "Effect of H and OH desorption and diffusion on electronic structure in amorphous In—Ga—Zn—O metal-oxide-semiconductor diodes with various gate insulators," Journal of Applied Physics, vol. 112, 2012, 7 pages.
(Continued)

*Primary Examiner* — Tung X Nguyen
(74) *Attorney, Agent, or Firm* — Oblon, McClelland, Maier & Neustadt, L.L.P.

(57) ABSTRACT

Provided is a method for simply evaluating defects caused in interface states in oxide semiconductor thin films and protective films in TFTs having protective films formed on the surface of oxide semiconductor thin films without actually measuring the characteristics of the same. This evaluation method evaluates defects caused in the interface states by measuring electron states in the oxide semiconductor thin film by a contact method or noncontact method. The defects caused in the interface states are any of the following: (1) threshold value voltage ($V_{th}$) when a positive bias is applied to the thin-film transistor, (2) difference in threshold value
(Continued)

voltage ($\Delta V_{th}$) before and after applying the positive bias to the thin-film transistor, and (3) threshold value during the first measurement when a plurality of measurements is made of the threshold value voltage when a positive bias is applied to the thin-film transistor.

13 Claims, 9 Drawing Sheets

(51) Int. Cl.
  *H01L 21/28* (2006.01)
  *H01L 29/786* (2006.01)
  *G01R 1/06* (2006.01)
  *G01R 31/27* (2006.01)
  *H01L 21/66* (2006.01)
  *H01L 29/66* (2006.01)
  *H01L 27/32* (2006.01)

(52) U.S. Cl.
  CPC .............. *G01R 31/27* (2013.01); *H01L 21/28* (2013.01); *H01L 22/12* (2013.01); *H01L 22/14* (2013.01); *H01L 29/66969* (2013.01); *H01L 29/786* (2013.01); *H01L 29/7869* (2013.01); *H01L 29/78693* (2013.01); *H01L 27/32* (2013.01)

(58) Field of Classification Search
  CPC ............ G01R 31/2626; G01R 31/2628; G09G 3/006; G09G 3/3233; G09G 2330/12; G09G 3/3241; G09G 3/325
  See application file for complete search history.

(56) References Cited

U.S. PATENT DOCUMENTS

| | | | |
|---|---|---|---|
| 2010/0301329 A1* | 12/2010 | Asano | H01L 27/1214 257/43 |
| 2011/0058155 A1 | 3/2011 | Ohno et al. | |
| 2012/0203473 A1 | 8/2012 | Hayashi et al. | |
| 2013/0153778 A1 | 6/2013 | Sakoda et al. | |
| 2014/0329339 A1* | 11/2014 | Chaji | G01R 31/26 438/10 |
| 2015/0091000 A1 | 4/2015 | Morita et al. | |
| 2015/0355095 A1 | 12/2015 | Hayashi et al. | |
| 2015/0371906 A1 | 12/2015 | Kishi et al. | |
| 2016/0223462 A1 | 8/2016 | Hayashi et al. | |

FOREIGN PATENT DOCUMENTS

| | | |
|---|---|---|
| JP | 2012-33857 A | 2/2012 |
| JP | 2013-168575 A | 8/2013 |
| JP | 2013-254948 A | 12/2013 |
| KR | 10-2012-0002459 | 1/2012 |

OTHER PUBLICATIONS

K. Nomura, et al., "Room-temperature fabrication of transparent flexible thin-film transistors using amorphous oxide semiconductors," Nature, vol. 432, Nov. 25, 2004, pp. 488-492.

K. Nomura, et al., "Bias stability for a—In—Ga—Zn—O-TFTs: Origin of threshold voltage instability and the role of thermal annealing and passivation," Proceedings of IDW, 2011, pp. 587-590.

International Search Report and Written Opinion dated Sep. 8, 2015 in PCT/JP2015/067848 filed Jun. 22, 2015.

* cited by examiner

QUALITY EVALUATION METHOD FOR LAMINATE HAVING PROTECTIVE LAYER ON SURFACE OF OXIDE SEMICONDUCTOR THIN FILM AND QUALITY CONTROL METHOD FOR OXIDE SEMICONDUCTOR THIN FILM

TECHNICAL FIELD

The present invention relates to a method for evaluating quality of a laminate including a protective film on a surface of an oxide having semiconductor properties (hereinafter, referred to as "oxide semiconductor thin film") used for a channel layer of a thin film transistor (TFT) used in a display such as a liquid crystal display or an organic EL display, and relates to a quality control method of the oxide semiconductor thin film. In detail, the invention relates to a technique for determining and evaluating a defect caused by an interface state between an oxide semiconductor thin film and a protective film formed on a surface of the oxide semiconductor thin film by a contact or noncontact manner.

BACKGROUND ART

An amorphous oxide semiconductor thin film has a high carrier mobility, i.e., a high electron mobility, and a large optical bandgap compared with amorphous silicon (a-Si) that has been used for a thin film transistor, and can be formed at low temperature. The amorphous oxide semiconductor thin film is therefore expected to be applied to a next-generation display requiring large size, high resolution, and high-speed drive, and to a transparent display or a flexible display manufactured on a resin substrate having low heat resistance.

Among such oxide semiconductor thin films, an amorphous oxide semiconductor thin film including indium (In), gallium (Ga), zinc (Zn), and oxygen (O) (a-In—Ga—Zn—O, hereinafter, also referred to as "a-IGZO" or simply "IGZO") is particularly preferred to be used because of its high carrier mobility. For example, NPTL 1 discloses a TFT in which an oxide semiconductor thin film of In:Ga:Zn=1.1=1.1=0.9 (atomic percentage) is used as a semiconductor layer (active layer) of TFT. PTL 1 discloses an amorphous oxide semiconductor including elements such as In, Zn, Sn, and Ga, and Mo, in which a ratio of an atomic number of Mo to an atomic number of all metals in the amorphous oxide semiconductor is 0.1 to 5 at %, and discloses TFT using an active layer including IGZO containing Mo in Example.

It is however known that properties of the oxide semiconductor thin film are varied due to a film formation step and subsequent heat treatment. For example, carrier concentration that dominates TFT characteristics greatly varies due to defect levels caused by lattice defects formed during the film formation step and impurities such as hydrogen in the film. This allows the TFT characteristics to be easily varied. In a manufacturing process of a display or the like, therefore, the following is important in light of improving productivity: Properties of an oxide semiconductor thin film are evaluated, and results of the evaluation are fed back to adjust a manufacturing condition for quality control of film quality.

With the TFT using the oxide semiconductor thin film, it is reported that TFT characteristics greatly vary depending on a process condition performed in a step other than the film formation step of the oxide semiconductor and the subsequent heat treatment. For example, NPTL 2 discloses that when an oxide semiconductor thin film is annealed, an electronic state in the oxide semiconductor film varies depending on a type of a gate insulating film used in the TFT, which resultantly greatly affects the TFT characteristics. NPTL 3 reports in detail that TFT characteristics are greatly affected by a type of a protective film formed on a surface of an oxide semiconductor thin film.

The TFT using the oxide semiconductor thin film requires not only mobility as a basic transistor characteristic but also good stress resistance. The stress resistance means that even if a semiconductor element such as a transistor receives stress, for example, continuous light irradiation or continuous application of a gate voltage, the semiconductor element maintains good characteristics without any change.

In one requirement for stress resistance, threshold voltage (hereinafter, also referred to as "$V_{th}$") does not shift in drain current-gate voltage characteristics (hereinafter, also referred to as "I-V characteristics"), which means a small amount of change in $V_{th}$ (hereinafter, also referred to as "$\Delta V_{th}$") between before and after stress application. For example, in an organic EL display, a positive voltage (hereinafter, also referred to as "positive bias") is continuously applied to a gate electrode of a drive TFT during light emission of the organic EL display, which disadvantageously varies a switching characteristic of the organic EL display.

In addition, a good initial repetition characteristic is necessary as the stress resistance. The initial repetition characteristic means a difference between $V_{th}$ calculated from I-V characteristics obtained at first measurement and $V_{th}$ calculated from I-V characteristics obtained after multiple times of measurement when the I-V characteristics are measured multiple times after TFT is manufactured. The smaller the difference (hereinafter, also referred to as "shift of $V_{th}$"), the better.

With the stress resistance, $V_{th}$ of TFT is also necessary to be controlled within a proper range. If $V_{th}$ has a minus value, current flows when the gate voltage is not applied, leading to an increase in power consumption. On the other hand, if $V_{th}$ has an extremely large positive value, TFT operation requires a large voltage to be applied to a gate.

If such a switching characteristic is thus varied due to stress by voltage application during use of TFT, reliability of the display itself, such as a liquid crystal display or an organic EL display, is reduced. It is therefore desired to improve stress resistance particularly after application of a positive bias.

In typical evaluation of stress resistance, there has been a problem that measurement under a longtime stress condition must be actually performed after TFT is manufactured through formation of a gate insulating film and a passivation insulating film on an oxide semiconductor thin film, and provision of electrodes.

CITATION LIST

Patent Literature

PTL 1: Japanese Unexamined Patent Application Publication No. 2009-164393

PTL 2: Japanese Unexamined Patent Application Publication No. 2012-33857

NON-PATENT LITERATURE

NPTL 1: Nature, VOL432, P488 (2004)
NPTL 2: Journal of Applied Physics Vol. 112, 114515 (2012)
NPTL 3: Proceedings of IDW, 587 (2011)

SUMMARY OF INVENTION

Technical Problem

The invention has been made in light of the above-described circumstance. An object of the invention is to provide a method for simply evaluating a defect caused by an interface state between an oxide semiconductor thin film and a protective film, specifically a method for simply evaluating stress resistance when positive-bias stress is applied to TFT without actually measuring such a property, and provide a quality control method of the oxide semiconductor thin film.

Solution to Problem

A quality evaluation method according to the invention, which has solved the above-described problem, is summarized by a quality evaluation method of a laminate including a protective film on a surface of an oxide semiconductor thin film, where a defect caused by an interface state between the oxide semiconductor thin film and the protective film is evaluated by measuring an electronic state of the oxide semiconductor thin film by a contact method or a noncontact method.

In the invention, the electronic state of the oxide semiconductor thin film is also preferably measured based on electrical resistivity of the oxide semiconductor thin film. In a preferred embodiment, the electrical resistivity is sheet resistance or specific resistance.

In a preferred embodiment of the invention, the defect caused by the interface state is one of the following (1) to (3)
(1) a threshold voltage $V_{th}$ of a thin film transistor,
(2) a difference in threshold voltage $\Delta V_{th}$ between before and after application of a positive bias when the positive bias is applied to the thin film transistor, and
(3) a difference between a threshold voltage at first measurement and a threshold voltage after multiple times of measurement when the threshold voltage of the thin film transistor is measured multiple times.

In a preferred embodiment of the invention, the oxide semiconductor thin film contains at least one element selected from the group consisting of In, Ga, Zn, and Sn.

In a preferred embodiment of the invention, the oxide semiconductor thin film of the laminate is provided on a surface of an insulating film formed on the substrate.

In a preferred embodiment of the invention, a defect caused by the interface state is evaluated using a laminate having a first electrode and a second electrode in contact with two respective sides of the protective film provided on the surface of the oxide semiconductor thin film.

In a preferred embodiment of the invention, when the defect caused by the interface state is measured by the contact method, electrodes are provided on the surface of the oxide semiconductor thin film, and the defect is evaluated based on a measured current value or a measured voltage.

In a preferred embodiment of the invention, when the defect caused by the interface state is measured by the noncontact method, the measurement includes a first step of irradiating the laminate with excitation light and a microwave, measuring the maximum of a reflected wave of the microwave from the oxide semiconductor thin film, the maximum being varied by irradiation of the excitation light, and then stopping irradiation of the excitation light, and measuring temporal change in reflectance of the reflected wave of the microwave from the oxide semiconductor thin film after stopping irradiation of the excitation light, and a second step of calculating a parameter corresponding to slow decay, the slow decay being observed after stopping irradiation of the excitation light, from the temporal change in reflectance to evaluate the electronic state of the oxide semiconductor thin film.

In a preferred embodiment of the invention, in the second step, a parameter corresponding to slow decay observed at 0.1 to 10 μs after stopping irradiation of the excitation light is calculated from the temporal change in reflectance to evaluate electrical resistivity of the oxide semiconductor thin film.

A quality control method of an oxide semiconductor thin film according to the invention, which has solved the above-described problem, is summarized in that the evaluation method of the oxide semiconductor thin film is applied to one step of a semiconductor manufacturing process.

Advantageous Effects of Invention

According to the invention, the electronic state of the oxide semiconductor thin film is measured by a contact method or a noncontact method, thereby a failure caused by an interfacial defect between the oxide semiconductor thin film and the protective film can be evaluated, predicted, and measured. Specifically, using the evaluation method of the invention eliminates the need of actual measurement of stress resistance, such as the shift amount of threshold voltage, the initial repetition characteristic, or an absolute value of the threshold voltage as a TFT characteristic.

The evaluation method of the invention is applied to one step of a semiconductor manufacturing process, thereby quality control of the oxide semiconductor thin film can be performed during a manufacturing process of TFT.

DESCRIPTION OF EMBODIMENTS

Figure 1:
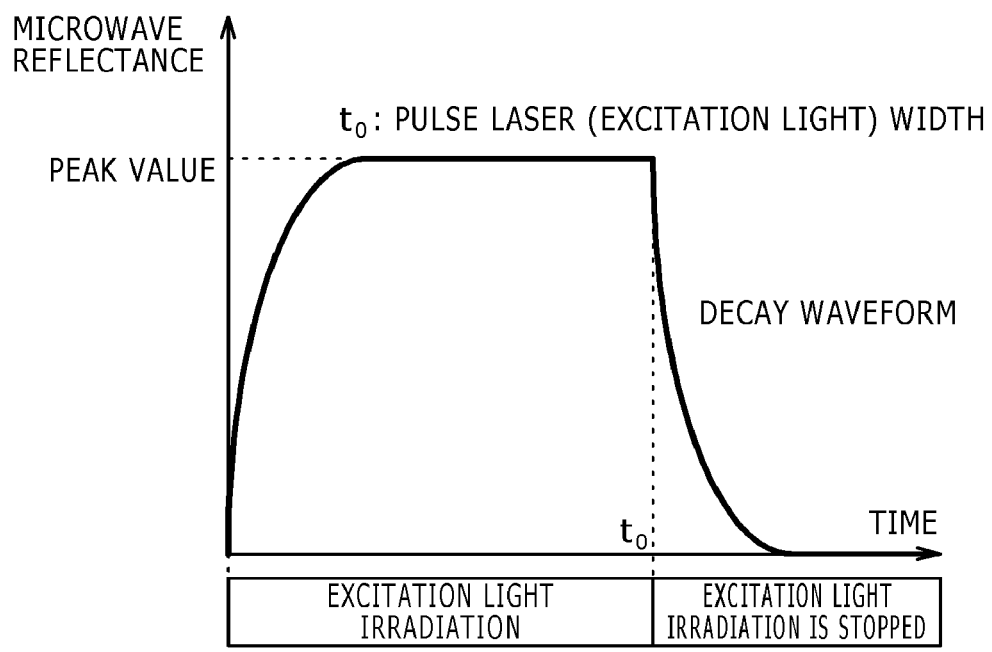
FIG. 1 is a diagram illustrating an exemplary microwave decay waveform.
Figure 2:
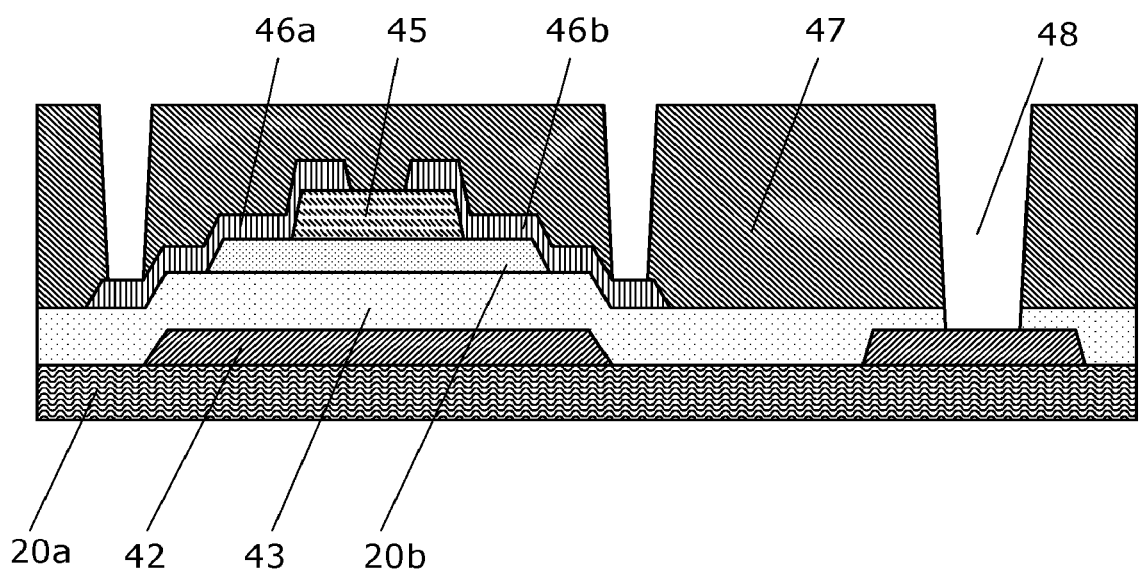
FIG. 2 is a schematic diagram illustrating a structure of an oxide semiconductor TFT used in Examples.

The inventors have made earnest investigations to achieve the above-described object. As a result, the inventors have found that an increase in shift amount $\Delta V_{th}$ of a threshold voltage, which occurs when a positive-bias stress is applied to TFT including an insulating film such as a gate insulating film, an oxide semiconductor thin film, a protective film provided on a surface of the oxide semiconductor thin film, and a first electrode and a second electrode such as a source electrode and a drain electrode, is caused by a defect of an interface state existing at an interface between the oxide semiconductor thin film and the protective film formed over the oxide semiconductor thin film. In the invention, TFT has at least the above-described configuration, and preferably has a configuration necessary for TFT used in display such as a liquid crystal display.

Furthermore, the inventors have found that the defect of the interface state induces band bending in the oxide semiconductor thin film, and consequently apparent resistance, i.e., an electronic state of the oxide semiconductor thin film is varied. Specifically, it has been found that the increase in $\Delta V_{th}$ occurring after application of a positive bias has a good correlation with electrical resistivity of an oxide semiconductor. The electrical resistivity includes sheet resistance ($\Omega \cdot cm/\square$) and specific resistance ($\Omega \cdot cm$). Specific resistance corresponds to a product of sheet resistance and thickness.

Hence, it has been found that an increase or decrease in $\Delta V_{th}$, which occurs after positive-bias application, can be simply evaluated only by measuring the electronic state, particularly electrical resistivity of the laminate, which includes the protective film on the surface of the oxide semiconductor thin film, without actually manufacturing TFT and performing a stress test that applies a positive bias to the TFT. In addition, $\Delta V_{th}$ tightly correlates with an initial repetition characteristic and an absolute value of a threshold voltage. Hence, it has been eventually found that measurement of the electronic state, particularly electrical resistivity of the oxide semiconductor thin film makes it possible to evaluate all of the following (1) to (3) as indicia of stress resistance associated with positive-bias application.

(1) Threshold voltage $V_{th}$ of a thin film transistor.
(2) A difference in threshold voltage $\Delta V_{th}$ between before and after application of a positive bias when the positive bias is applied to the thin film transistor.
(3) A threshold voltage at first measurement when the threshold voltage of the thin film transistor is measured multiple times.

Furthermore, investigation results of the inventors have revealed that although the electrical resistivity may be directly measured by a measuring means with a known contact method such as, for example, a four-terminal method or a four-probe method, the electrical resistivity can be indirectly measured in a non-destructive and noncontact manner based on a noncontact method such as a μ-PCD method as described later.

Furthermore, investigation results of the inventors have revealed that the electrical resistivity may be measured using a laminate having a sectional structure similar to that of TFT instead of actually manufacturing TFT. Specifically exemplified are a laminate having an oxide semiconductor thin film and a protective film formed on a surface of the oxide semiconductor thin film, preferably a laminate having a first electrode and a second electrode in contact with two respective sides of the protective film, and further preferably a laminate as one of such laminates, which however includes the oxide semiconductor thin film provided on a surface of an insulating film formed on the substrate. The inventors have finally found that the desired end is achieved by measuring electrical resistivity of the oxide semiconductor thin film of the laminate in the same way as described above, and have completed the invention.

For example, since the shift of the threshold voltage occurring at positive-bias application as described in (2) occurs at an interface between the oxide semiconductor thin film and a protective film such as an etch stop layer (hereinafter, also referred to as "ESL") for directly protecting the surface of the oxide semiconductor thin film, electrical resistivity of that oxide semiconductor thin film should be measured. Specifically, TFT satisfying the above-described configuration requirements may be used to measure the electrical resistivity. The TFT may have only the ESL on the surface of the oxide semiconductor thin film, or may further have a protective film for protecting the entire ESL on the ESL. When the ESL is not provided, a passivation film may be provided on the surface of the oxide semiconductor thin film. The TFT may have any of configurations required for various liquid crystal displays without being limited to the exemplified structure. Alternatively, the TFT may have a sectional structure similar to that of the TFT.

When superiority or inferiority of a defect caused by an interface state is evaluated between two or more samples, a series of manufacturing conditions up to formation of the oxide semiconductor thin film are each set to be the same. For example, for a laminate having a sectional structure similar to that of TFT, each of manufacturing conditions for forming the oxide semiconductor thin film on a substrate, such as a film type and a heat treatment step, is set to be the same as that for the TFT. Alternatively, for manufacturing TFTs, when an electrode such as a gate electrode, an insulating film such as a gate insulating film, and the oxide semiconductor thin film are formed on a substrate, each of the film formation conditions including a film type and a heat treatment step is set to be the same.

The interfacial defect is different from a defect (hereinafter, referred to as "in-film defect") in the oxide semiconductor thin film. Specifically, as a result of investigations of the inventors, unevenness in luminance of a display is caused by shift of a threshold voltage at application of a positive bias, which is affected by the interfacial defect. On the other hand, washed-out color or bad display of the display is caused by shift of a threshold voltage due to light irradiation and a negative bias (hereinafter, also referred to as "negative-bias stress"), which is affected by the in-film defect. Hence, such two types of defects are different in position in the oxide semiconductor thin film and in position of a failure caused by the defect. Consequently, the formation conditions of the oxide semiconductor thin film are set to be the same so that the in-film defects are in the same state as described above, thereby superiority or inferiority of a defect caused by the interface state can be evaluated.

There is now described a case of directly measuring the electrical resistivity, which indicates a variation in electronic state of the oxide semiconductor thin film, by a contact method.

When the electrical resistivity of the oxide semiconductor thin film is measured by a contact method, electrodes are provided on the surface of the oxide semiconductor thin film to measure a current value or a voltage. For example, ohmic electrodes are formed on the oxide semiconductor thin film, and thus electrical resistivity between such two electrode points are simply measured. Specifically, a voltage of, for example, 1 V should be applied to measure a value of a current flowing between the electrodes.

For example, in the four-terminal method, two pairs of ohmic electrodes are provided to measure the electrical resistivity. In the method, a current is applied between one pair of electrodes formed on the oxide semiconductor thin film, so that a voltage between another pair of electrodes can be measured.

Alternatively, the electrical resistivity may be measured by a four-probe method in place of the four-terminal method. For example, the measuring method standardized by JIS H602 may be used as the method for measuring the electrical resistivity by the four-probe method.

For measurement of electrical resistivity by the four-probe method, if the surface of the oxide semiconductor thin film is covered with the protective film or the like, the electrical resistivity cannot be measured. The protective film is therefore removed only from portions, in each of which a probe is to be in contact with the surface of the oxide semiconductor thin film, so that probes can come into contact with the surface of the oxide semiconductor thin film. This allows electrical resistivity to be measured by the four-probe method.

The contact method, in which no electrode is formed on the oxide semiconductor thin film, includes a measuring method such as a double ring electrode method. In this measuring method, a measuring probe is directly brought into contact with the surface of the oxide semiconductor thin film, and a current can be applied between the electrodes of the probe to determine electrical resistivity. Hence, the double ring electrode method is preferably simple and inexpensive compared with the four terminal method or the four probe method that is necessary to have electrodes.

There is now described a method for measuring the electronic state of the oxide semiconductor thin film by a noncontact method. In the noncontact method, the electronic state is measured while a resistance measuring terminal is not in contact with the oxide semiconductor thin film. The electronic state may be indirectly measured by the noncontact method in a nondestructive and noncontact manner. Examples of the noncontact method include the μ-PCD method. The μ-PCD method cannot directly measure the electrical resistivity unlike the contact method. However, as described later, since a measured value by the μ-PCD method is in a correlation with the electrical resistivity, the electrical resistivity can be indirectly evaluated.

Indirect measurement of the electrical resistivity of the oxide semiconductor thin film by the noncontact method includes a first step of irradiating the laminate including the protective film on the surface of the oxide semiconductor thin film with excitation light and a microwave, measuring the maximum of a reflected wave of the microwave from the oxide semiconductor thin film, the maximum being varied by the excitation light irradiation, and then stopping the excitation light irradiation, and measuring temporal change in reflectance of the reflected wave of the microwave from the oxide semiconductor thin film after stopping the excitation light irradiation, and a second step of calculating a parameter corresponding to slow decay, which is observed after stopping the excitation light irradiation, from the temporal change in reflectance.

In other words, the invention uses a microwave photoconductive decay method (hereinafter, also referred to as "μ-PCD method") described in PTL 2. Specifically, the invention is characterized in that a slow microwave decay waveform as part of microwave decay given by the method of PTL 2, which is observed at about 1 μs after stopping the excitation light irradiation, i.e., a degree of microwave decay tightly correlates with stress resistance or the like of the oxide semiconductor thin film subjected to a stress application test of a positive bias (hereinafter, also referred to as positive-bias stress application test), and the stress resistance is found to be extremely useful as an index to correctly and simply evaluate, predict, and measure the stress resistance in a noncontact manner.

In this description, the above-described "parameter corresponding to slow decay observed at about 1 μs after stopping the excitation light irradiation" includes, for example, time from a maximum to $1/e^2$ of the maximum of microwave reflection intensity; a slope obtained by logarithmic conversion of a decay curve of reflected-wave intensity ranging from $1/e$ to $1/e^2$ of the maximum of the microwave reflection intensity, or an absolute value of a reciprocal of the slope; a slope of the decay curve of reflected-wave intensity at about 1 to 2 μs after stopping the excitation light irradiation, or an absolute value of a reciprocal of the slope; the reflected-wave intensity of the microwave observed at about 1 μs after stopping the excitation light irradiation, and in the case of representing decay of the reflected-wave of the microwave by the sum of two exponential functions, a value of larger one between slopes obtained through logarithmic conversion, or an absolute value of a reciprocal of the slope. For example, a B value is given as the slope, the B value being represented by a power-low relational expression of Formula (1) in Example 2 as described later. The above-described "slopes obtained by logarithmic conversion when decay of the reflected-wave of the microwave is represented by the sum of two exponential functions" means $\tau_1$ in Formula (1) below and $\tau_2$ in Formula (2) below, for example.

Numerical Formula 1

$$n_1 \exp(-t/\tau_1) + n_2 \exp(-t/\tau_2) \tag{1}$$

Numerical Formula 2

$$n_1 \exp(-t/\tau_1) + n_2 \exp(-t/\tau_2)^\beta \tag{2}$$

Among such parameters, preferred is the slope obtained by logarithmic conversion of a decay curve of reflected microwave intensity in a particular range, or the absolute value of a reciprocal of the slope. Particularly preferred is the slope obtained by logarithmic conversion of the decay curve of reflected-wave intensity ranging from $1/e$ to $1/e^2$ of the maximum, or the absolute value of the reciprocal of the slope, and the slope of the decay curve of reflected-wave intensity at about 1 μs to about 2 μs, or the absolute value of the reciprocal of the slope.

In the description of the parameter, "about 1 μs" is not intended to be strictly limited to 1 μs, but is intended to include a range of microwave reflectance in a slow decay region of reflectance after stopping excitation light irradiation, i.e., in a region of a gentle slope of decay of reflectance. The time is therefore difficult to be uniquely defined, but, for example, the time typically includes 0.5 to 1 μs, 0.5 to 1.5 μs, and 1 to 2 μs.

The above-described "slow decay" is described in detail with FIG. 1. FIG. 1 is a diagram illustrating an aspect of generation and annihilation of excess carriers in the μ-PCD method. The abscissa of FIG. 1 corresponds to reflectance of a microwave. When the laminate is irradiated with excitation light, the light is absorbed by the oxide semiconductor thin film and excess carriers, i.e., excited carriers are generated. At this time, as excess carrier density increases, excess carrier annihilation rate increases, and when carrier injection rate becomes equal to carrier annihilation rate, the excess carrier density has a certain peak value. When the excess carrier generation rate becomes equal to the excess carrier annihilation rate, the excess carrier density is saturated and maintains a certain value. As well known, when irradiation of the excitation light is stopped in such a state, the excess carriers decrease through recombination and annihilation of the excess carriers, and finally return to a value before irradiation of the excitation light.

As illustrated in FIG. 1, the reflectance of the reflected wave of the microwave from the oxide semiconductor thin film temporarily indicates the maximum, but rapidly decays simultaneously with stopping irradiation of the excitation light. After that, decay with a certain slope is observed. The slope roughly corresponds to the above-described "parameter corresponding to slow decay observed after stopping the excitation light irradiation". The decay is affected by the in-film defect or the interfacial defect.

Specifically, the slope includes, for example, a slope of reflectance as reflected-wave intensity to time in the above-described range, and a slope of a value obtained by logarithmic conversion of reflected-wave intensity to a value obtained by logarithmic conversion of the time in the above-described range. The B value in Formula (1) is used in Example 2 as described later. As described before, the slope includes a slope given when decay of reflectance becomes slow after stopping excitation light irradiation.

Figure 16:
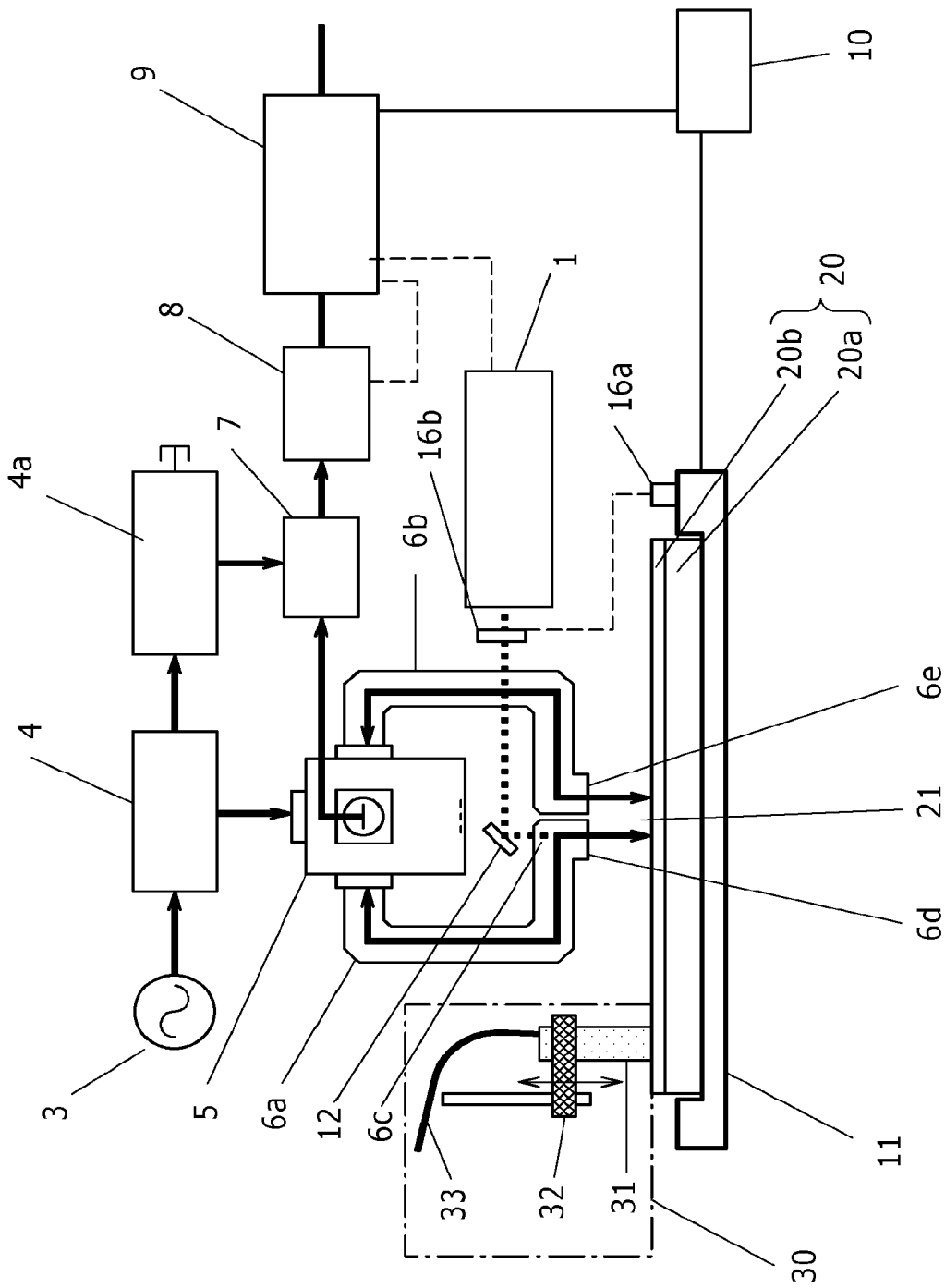
FIG. 16 is an explanatory schematic diagram illustrating an exemplary evaluation apparatus used in the invention.

Such an evaluation method is now described in detail. In the invention, an apparatus allowing the measurement using the μ-PCD method includes, for example, an apparatus as illustrated in FIG. 16 as described in detail later, and a lifetime measuring apparatus as illustrated in FIG. 1 of PTL 2. Since the apparatus of PTL 2 is described in detail in PTL 2, such literature should be seen. However, the apparatus used in the invention is not limited thereto.

First, a sample having the oxide semiconductor thin film is prepared. The sample used in the invention is a laminate, in which the oxide semiconductor thin film and the protective film formed on the oxide semiconductor thin film are provided on a substrate. The laminate may include any of laminates having the above-described various configurations.

An amorphous oxide semiconductor thin film containing at least one element selected from the group consisting of In, Ga, Zn, and Sn is preferably used as the oxide semiconductor thin film. Such elements may be contained singly or in combination. Specifically, the oxide includes, for example, In oxide, In-Sn oxide, In—Zn oxide, In—Sn—Zn oxide, In—Ga oxide, Zn—Ga oxide, In—Ga—Zn oxide, and Zn oxide.

Thickness of the oxide semiconductor thin film is preferably about several tens nanometers to about five hundred nanometers, for example. The upper limit of the thickness is more preferably 200 nm or less, and further preferably 100 nm or less. The lower limit of the thickness is more preferably 10 nm or more, and further preferably 30 nm or more.

The substrate may include any type of substrate typically used in the technical field of the invention. For example, the substrate includes glass substrates for a liquid crystal display called first generation to tenth generation, having a thickness of about 0.7 mm, and a size of several tens centimeters square to more than several meters square.

The protective film (hereinafter, also referred to as "passivation insulating film") includes both a protective film for directly protecting the surface of the oxide semiconductor thin film (hereinafter, also referred to as "etch stop layer" or "ESL"), and a protective film for further protecting the surface of that protective film (hereinafter, also referred to as "passivation film").

Such a laminate is irradiated with excitation light and a microwave.

As described above, when the laminate is irradiated with excitation light, density of excess carriers generated as described above increases, and indicates a certain peak value. In addition, when irradiation of the excitation light is stopped, the excess carriers decrease, and finally return to a value before irradiation of the excitation light.

In the invention, a variation in excess carrier density is analyzed, thereby the carrier concentration of the oxide semiconductor thin film can be determined, and the electronic state, in turn electrical resistivity, i.e., sheet resistance or specific resistance can be evaluated probably due to the following reason.

The microwave applied to the laminate is reflected by plasma oscillation caused by carriers existing in the oxide semiconductor thin film. In this case, reflectance depends on carrier density in the oxide semiconductor thin film. The oxide semiconductor thin film in a steady state however does not have the number of carriers that allows practical observation of microwave reflection. However if the oxide semiconductor thin film is irradiated with the excitation light, excess carriers are generated in the film, and the reflectance of the microwave is increased by plasma oscillation of the excess carriers. On the other hand, as the number of the excess carriers decreases along with stop of the excitation light irradiation, the reflectance of the microwave also decreases.

Carriers are typically generated in a silicon semiconductor or the like due to shallow donor levels below a conduction band in an energy band. In such a case, an energy level is about several tens of milli-electron volts below the conduction band, and thus most carriers are being activated near room temperature. As generally known, carriers in the oxide semiconductor thin film in a steady state are also caused by shallow donor levels existing below a conduction band in an energy band. In the oxide semiconductor, however, the levels of the carriers are each relatively deep, about 0.1 to 0.2 eV. Hence, the excess carriers generated by the excitation light irradiation may be recombined in a form of excited holes and electrons, or may be temporarily captured by the donor level and then re-emitted. The ratio of such capture and reemission depends on the amount of the shallow donor level existing below the conduction band in the energy band. Hence, the annihilation process observed after stopping the excitation light is traced for the excess carriers caused by the excitation light irradiation, thereby influence of the amount of the donor level can be analyzed. While the specific resistance of the oxide semiconductor thin film is represented by the product of charge, free electron, and mobility, the mobility of the oxide semiconductor thin film does not significantly vary as long as a composition of metal elements as components of the oxide semiconductor thin film is constant. For example, the mobility of a-IGZO is about 10 $cm^2/VS$. Hence, change in reflectance of the microwave, i.e., change in excess carrier density, observed by the μ-PCD method roughly correlates with each of the carrier concentration and the electrical resistivity.

Amorphous semiconductor materials such as an oxide semiconductor include a material having continuous levels between a conduction band and a donor level, for example, amorphous silicon and IGZO. In such a case, an annihilation process of carriers observed in the μ-PCD method can be understood as superimposition of individual carrier transition behaviors between the respective levels. As a result, the decay process is observed over a somewhat long time span compared with transition between two levels. The time dependence of such decay has a power-law relationship with time.

Hence, after the first step, the parameter corresponding to the slow decay observed in a time span roughly ranging from 0.1 to 10 μs is calculated, thereby the carrier density of the oxide semiconductor thin film can be determined. The electrical resistivity such as sheet resistance or specific resistance can be indirectly evaluated based on the determination result.

Hereinbefore, there has been described in detail a method for measuring the electronic state, particularly electrical resistivity, of the oxide semiconductor thin film in a non-contact manner by the μ-PCD method.

The invention also includes a method for performing quality control of the oxide semiconductor thin film by applying the evaluation method, which evaluates a defect caused by an interface state between the oxide semiconductor thin film and the protective film, to one step of the semiconductor manufacturing process.

The evaluation method is applied to one step, which affects the interface state, of the manufacturing process, thereby the evaluation results of the electronic state, i.e., the electrical resistivity of the oxide semiconductor thin film is fed back, and thus film quality can be controlled through adjustment of the manufacturing conditions or the like; hence, quality control of the oxide semiconductor can be properly performed.

In particular, in the invention, the evaluation method of the invention is preferred to be applied to the case where the protective film is formed on the produced oxide semiconductor thin film, or the case of subsequently performing heat treatment (hereinafter, also referred to as "post-annealing").

Using the evaluation method of the invention allows stress resistance of the oxide semiconductor thin film to be simply evaluated in a short time and at low cost in a stage of developing a material for the oxide semiconductor thin film. Moreover, using the evaluation method of the invention makes it possible to perform in-line evaluation of electrical properties of the oxide semiconductor thin film in a short time in a manufacturing line of a liquid crystal display or the like. Furthermore, since the μ-PCD method allows noncontact measurement, productivity such as a production yield can be improved, and quality control of the oxide semiconductor can be properly performed.

In the invention, the following evaluation element can be used for one of the described evaluation methods. The evaluation element includes the oxide semiconductor thin film on the substrate and the protective film on that oxide semiconductor thin film.

Specifically, for example, the following evaluation element (a) or (b) is given.

Figure 4:
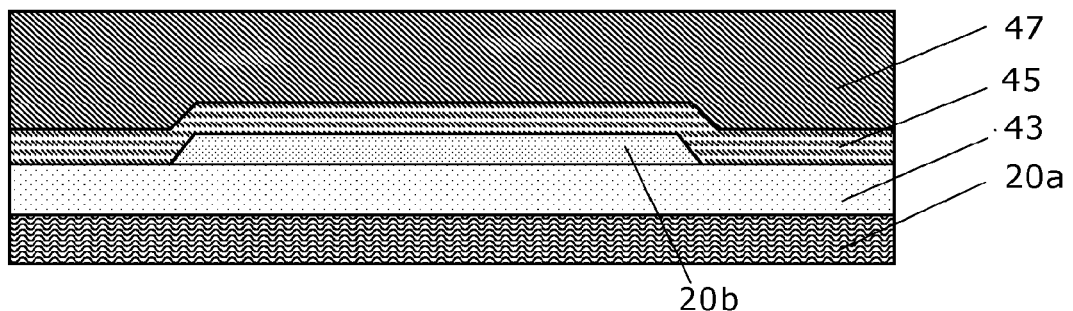
FIG. 4 is a schematic diagram illustrating another exemplary configuration of the evaluation element used in the invention.
Figure 5:
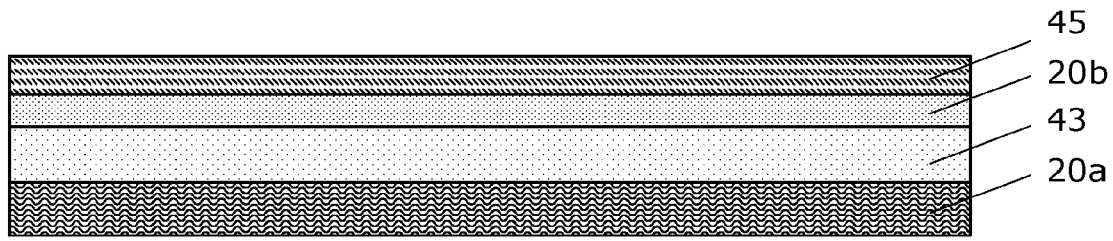
FIG. 5 is a schematic diagram illustrating another exemplary configuration of the evaluation element used in the invention.

(a) An evaluation element in which the oxide semiconductor thin film is directly formed on the surface of the substrate, and the protective film including, for example, the etch stop layer 45 illustrated in FIG. 5 and the passivation film 47 illustrated in FIG. 4 is formed on the surface of the oxide semiconductor thin film (b) An evaluation element in which the oxide semiconductor thin film is directly formed on the surface of an insulating film such as the gate insulating film, and the protective film including, for example, the etch stop layer 45 illustrated in FIG. 5 and the passivation film 47 illustrated in FIG. 4 is formed on the surface of the oxide semiconductor thin film. Although the invention is described with the gate insulating film as a typical example of the insulating film, the insulating film should be merely provided between the substrate and the oxide semiconductor thin film while being not limited to the gate insulating film In the evaluation element, it is important that the oxide semiconductor thin film is directly provided on the surface of the substrate or the gate insulating film as described in (a) or (b). Specifically, a metal electrode, for example, the gate electrode does not exist directly below the oxide semiconductor thin film This is because if the gate electrode or the like exists directly below the oxide semiconductor thin film, since the gate electrode has a large number of electrons as free carriers, $10^{18}$ $cm^{-3}$ or more, influence of the gate electrode on the reflectance of the microwave becomes dominant.

An exemplary configuration of the evaluation element used in the invention is illustrated in FIGS. 3 to 6. As illustrated in FIGS. 3 to 6, no metal electrode is provided directly below the oxide semiconductor thin film.

Figure 3:
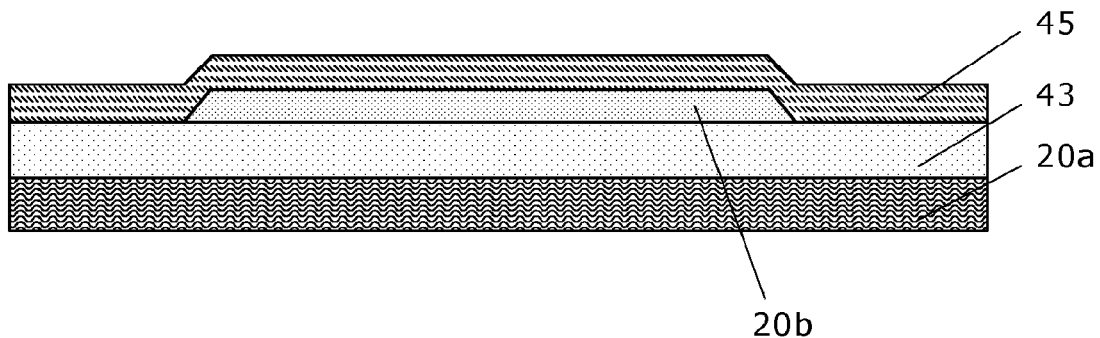
FIG. 3 is a schematic diagram illustrating an exemplary configuration of an evaluation element used in the invention.

In FIG. 3, the gate insulating film 43 such as a glass substrate, a patterned oxide semiconductor thin film 20*b*, and a patterned etch stop layer 45 as a protective film are formed in this order on the substrate 20*a*.

In FIG. 4, the gate insulating film 43, the patterned oxide semiconductor thin film 20*b*, the patterned etch stop layer 45, and a passivation film 47 are formed in this order on the substrate 20*a*.

In FIG. 5, the gate insulating film 43, the oxide semiconductor thin film 20*b*, and the etch stop layer 45 are formed in this order on the substrate 20*a*.

Figure 6:
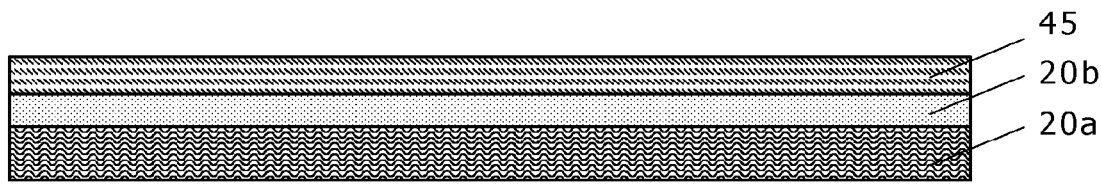
FIG. 6 is a schematic diagram illustrating another exemplary configuration of the evaluation element used in the invention.

In FIG. 6, the oxide semiconductor thin film 20*b* and the etch stop layer 45 are formed in this order on the substrate 20*a*.

Furthermore, the invention may also employ an evaluation substrate, on which a plurality of evaluation elements are arranged, each evaluation element being one of the above-described evaluation elements.

Figure 7:
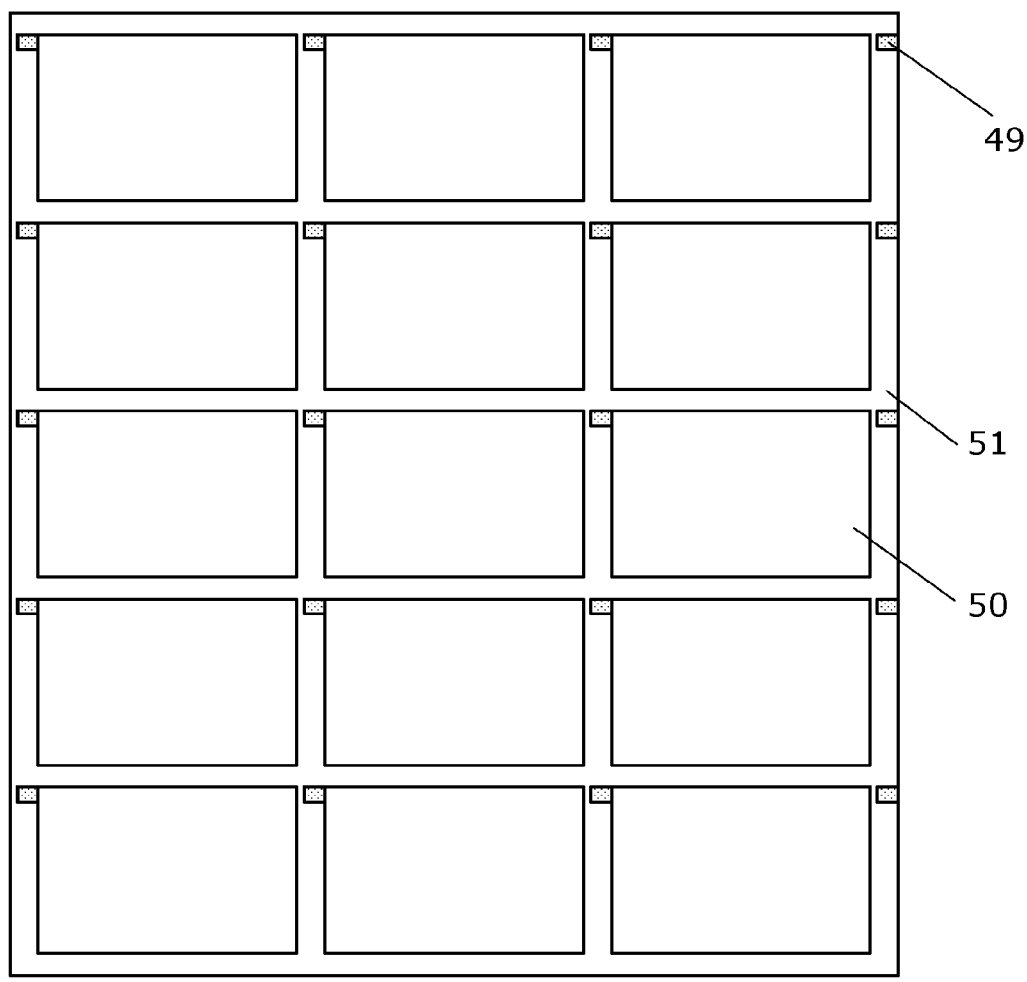
FIG. 7 is a schematic diagram of an evaluation substrate illustrating an exemplary arrangement configuration of evaluation elements used in the invention.

FIG. 7 is a schematic diagram illustrating an exemplary arrangement configuration of the evaluation substrate. As illustrated in FIG. 7, a display 50 and a plurality of evaluation elements 49 are regularly arranged on a mother glass 51 such as a glass substrate used in a mass production line. Using such an evaluation substrate makes it possible to perform quality control of the oxide semiconductor thin film, specifically measure distribution in a substrate plane, i.e., in-plane variations in electrical resistivity, and inter-substrate distribution, i.e., variations in electrical resistivity between substrates.

An embodiment of an evaluation apparatus used in the invention is now described in detail with drawings. However, the evaluation apparatus is not limited to the following configuration, and may be appropriately modified or altered.

FIG. 16 is a schematic diagram illustrating an exemplary configuration of an apparatus used for the evaluation method of the oxide semiconductor thin film. The evaluation apparatus illustrated in FIG. 16 includes an excitation light irradiation means 1 that irradiates a measurement site of a sample 20 including an oxide semiconductor thin film 20b provided on a substrate 20a with excitation light to generate electron-hole pairs in the oxide semiconductor thin film, a microwave irradiation means 3 that irradiates the measurement site of the sample 20 with a microwave, a reflected-microwave intensity detection means 7 that detects intensity of a reflected microwave of the microwave from the sample 20, the intensity being varied by the excitation light irradiation, and a means for evaluating electrical resistivity of the sample 20 based on the detection data of the reflected-microwave intensity detection means. This configuration makes it possible to indirectly measure and evaluate change in reflectance and the electrical resistivity by one apparatus.

The excitation light irradiation means 1 has a light source that outputs excitation light to irradiate the sample 20, and allows electron-hole pairs to be generated in the oxide semiconductor thin film through excitation light irradiation. The excitation light irradiation means 1 preferably has a light source that outputs energy equal to or larger than the bandgap of the oxide semiconductor thin film. The light source effectively generates carriers through outputting the energy equal to or larger than the bandgap of the oxide semiconductor thin film, which preferably leads to sensitive measurement. The excitation light irradiation means 1 should include an ultraviolet laser as the light source, for example. Specifically, the ultraviolet laser includes a semiconductor laser such as a pulsed laser that emits pulsed ultraviolet light, for example, a third harmonic of a YF laser as the excitation light, the pulsed ultraviolet light having a wavelength of 349 nm, power of 1 µJ/pulse, a pulse width of about 15 ns, and a beam diameter of about 1.5 mm.

The excitation light irradiation means 1 receives a timing signal transmitted from an evaluation means 9 (as indicated by a broken line in the figure), and outputs pulsed light as the excitation light with the reception of the timing signal as a trigger. The timing signal is transmitted to a signal processor 8 at the same time. The excitation light can be output from the excitation light irradiation means 1 while output power of the excitation light is adjusted by an output adjustment power monitor 16a and an output adjustment means 16b.

The excitation light output from the excitation light irradiation means 1 is reflected by an optical-path change means (hereinafter, also referred to as mirror) 12 such as a mirror, and is condensed by an undepicted condensing means (hereinafter, also referred to as condensing lens) such as a condensing lens, and passes through a small opening 6c provided in a first waveguide 6a, and is applied to a measurement site having a diameter of, for example, about 5 to 10 µm of the sample 20 through an end (opening 6d), which is close to the sample 20, of the first waveguide 6a. In this way, the mirror 12 and the condensing lens condense the excitation light output from the excitation light irradiation means 1, and guide the excitation light to the measurement site of the sample 20. Consequently, excited carriers are generated in a small excitation light irradiation region 21 as the measurement site of the sample 20.

The microwave application means 3 outputs a microwave to be applied to the measurement site of the sample 20. Examples of the microwave application means 3 include a microwave oscillator such as a Gunn diode resonating at a frequency of 26 GHz.

A directional coupler 4 bifurcates the microwave output from the microwave application means 3. One of the bifurcated output waves (hereinafter, referred to as first microwave Op1) is transmitted to a magic T (5) side, while the other bifurcated output wave (hereinafter, referred to as second microwave Op2) is transmitted to a LO input terminal of the reflected-microwave intensity detection means 7 via a phase regulator 4a. The directional coupler 4 is a 10 dB coupler, for example.

The magic T (5) bifurcates the first microwave Op1, and outputs a difference signal Rt1 (hereinafter, also referred to as "reflected-wave difference signal") between reflected waves of the bifurcated first microwaves from the sample 20 and a sum signal of the reflected waves.

One of the microwaves Op1 bifurcated by the magic T (5) (hereinafter, also referred to as "first main microwave Op11") is guided to the measurement site including an excited portion of the sample 20 by the first waveguide 6a connected to the magic T (5), and is radiated from the opening 6d at an end of the first waveguide Ga. Consequently, the first main microwave Op11 is applied to the measurement site of the sample 20. Furthermore, the first waveguide 6a serves as an antenna (hereinafter, also referred to as "waveguide antenna") radiating the first main microwave Op11, and serves to capture the reflected wave of the first main microwave Op11, which is applied to the measurement site, by the opening 6d at the end of the first waveguide 6a, and guide back the captured reflected wave to the magic T (5).

The other of the first microwaves Op1 bifurcated by the magic T (5) (hereinafter, referred to as "first sub microwave Op12") is guided to the vicinity, but containing no excited region by the excitation light, of the measurement site of the sample 20a by a second waveguide 6b connected to the magic T (5), and is radiated from an opening 6e at an end of the second waveguide 6b. Consequently, the first sub microwave Op12 is applied to the vicinity of the measurement site of the sample 20a. Furthermore, the second waveguide 6b serves as a waveguide antenna radiating the first sub microwave Op12, and serves to capture the reflected wave of the first sub microwave Op12, which is applied to the vicinity of the measurement site, by the opening 6e at the end of the second waveguide 6b, and guide back the captured reflected wave to the magic T (5). The path length along which the first waveguide 6a guides the microwave is equal to the path length along which the second waveguide 6b guides the microwave.

A difference signal, i.e., a reflected-wave difference signal Rt1, between the two reflected waves guided to the magic T (5) by the first waveguide 6a and the second waveguide 6b, the reflected waves being caused by reflection of the bifurcated first microwaves Op11 and Op12 on the sample 20, is output by the magic T (5) and transmitted to an RF input terminal of the reflected-microwave intensity detection means 7.

The reflected-microwave intensity detection means 7 mixes the second microwave Op2 and the reflected-wave difference signal Rt1, and thus outputs a detection signal Sg1. The detection signal Sg1 indicates an example of intensity of the reflected-wave difference signal Rt1, for example, intensity of the reflected wave of the first microwave Op1 applied to the sample 20, and is sent to the signal processor 8. The intensity of the reflected-wave difference signal Rt1 is varied by excitation light application to the sample 20 held at a predetermined position by a substrate holder. In this way, the reflected-microwave intensity detection means 7 detects the intensity of the reflected-wave difference signal Rt1. A mixer or a microwave detector (hereinafter, also referred to as "detector"), which receives a microwave and outputs an electric signal, i.e., a current or a voltage, corresponding to the intensity of the microwave, may be provided as the reflected-microwave intensity detection means 7.

The intensity of the reflected-wave difference signal Rt1 detected by the reflected-microwave intensity detection means 7 is varied by excitation light application to the measurement site of the sample 20. Specifically, the intensity of the reflected-wave difference signal Rt1 is temporarily increased by the excitation light irradiation and then decays. As the measurement site has more impurities or defects, a peak value of the intensity of the reflected-wave difference signal Rt1 becomes smaller, and decay time of the intensity, i.e., carrier lifetime also becomes shorter.

The intensity of a reflected-wave difference signal Rt1 is varied by the excitation light irradiation, and slow decay is observed after stopping the excitation light irradiation after the peak value of the intensity appears. A parameter corresponding to the slow decay is an index for evaluating the electronic state i.e., the electrical resistivity of the sample 20.

The signal processor 8 detects a peak value Sp of a variation in intensity of the reflected-wave difference signal Rt1 detected by the reflected-microwave intensity detection means 7, and transmits the detection result to the evaluation means 9. More specifically, the signal processor 8 receives a timing signal from the evaluation means 9, and monitors a variation in the reflected-wave difference signal Rt1 for a predetermined time with the reception of the timing signal as a trigger, and detects the maximum of a level of the reflected-wave difference signal Rt1 obtained during such monitoring as the peak value Sp of the variation in intensity of the reflected-wave difference signal Rt1. The signal processor 8, which includes a delay circuit that performs delay processing on the reflected-wave difference signal Rt1, sequentially detects signal intensity of the delay-processed signal at a predetermined sampling frequency, and detects the peak value Sp of the variation in intensity of the reflected-wave difference signal Rt1 from variations in the detected value.

A computer including CPU, a storage, and an input-output signal interface can be used as the evaluation means 9, and performs various types of processing through execution of a predetermined program by the CPU.

For example, the evaluation means 9 outputs a timing signal indicating output timing of the excitation light to the excitation light irradiation means 1 and a signal processor 8, and captures a peak value Sp of the reflected-wave difference signal Rt1 detected by the signal processor 8 and stores the peak value Sp in the storage of the evaluation means 9. The stored reflected-wave difference signal Rt1 (detection data) is used for evaluation of the electronic state, i.e., the electrical resistivity of the sample 20.

A stage controller 10 controls an X-Y stage 11 according to an instruction from the evaluation means 9, and thus performs positioning control of the measurement site of the sample 20.

An undepicted sample stage is provided over the X-Y stage 11. The sample stage is a plate-like conductor component including a metal such as aluminum, stainless steel, or iron, or another conductor. An undepicted substrate holder is provided over the sample stage, and the sample 20 is placed on the substrate holder. Consequently, the sample stage is disposed on a side opposite to a side on which the sample 20 is irradiated with the first microwaves Op11 and Op12, i.e., disposed on a lower side of the sample 20.

The substrate holder is a solid dielectric fixed on the upper side of the sample stage. The substrate holder is the solid dielectric inserted between the substrate and the sample stage, and includes a material that is a dielectric having a relatively large refractive index, such as glass or ceramics. This shortens the wavelength of the microwave passing through the substrate holder as a medium, so that a relatively thin and light substrate holder can be used.

In this way, according to the configuration for evaluating the electronic state of the oxide semiconductor thin film of the invention, photoexcited carriers are generated in the oxide semiconductor thin film by the excitation light output from the excitation light irradiation means 1, and the photoexcited carriers move by the electric field of the microwave output from the microwave irradiation means 3. The kinetic state of the photoexcited carriers is affected by impurities, defects, and the like in the semiconductor. Hence, intensity of the reflected microwave from the sample is detected by the reflected-microwave intensity detection means 7, and a variation in excess carrier concentration is analyzed by the evaluation means 9 as described before, which makes it possible to determine the carrier concentration in the oxide semiconductor thin film and indirectly evaluate the electrical resistivity from a variation in electronic state. At this time, the evaluation means 9 may control a position of a stage including an X-Y table 11 to allow mapping measurement that determines electrical resistivity in a predetermined range.

Furthermore, the evaluation apparatus is further provided with an electrical resistance measuring means, thereby it is possible to provide an apparatus not only performing evaluation of the electrical resistivity, but also performing in-line evaluation of the electrical properties of the oxide semiconductor thin film in a short time. In the above-described evaluation of the electrical resistivity, the electrical resistivity is evaluated based on the so-called slow decay. Through investigations, the inventors have found that the slow decay is also affected by the in-film defects in the oxide semiconductor thin film. Hence, the electrical resistivity, which is measured and evaluated based on the μ-PCD method, is also varied depending on the number of the in-film defects. The electrical resistivity of the oxide semiconductor thin film may be varied due to contamination or impurities even in the same plane, and thus the value of the electrical resistivity varies depending on measurement points. To perform proper quality control of the oxide semiconductor thin film, therefore, it is important that a measurement point by the μ-PCD method is substantially equal to a measurement point by the electrical resistivity measuring means.

If the evaluation system therefore has an electrical resistance measuring means, the two types of measurement can be easily and accurately performed at substantially the same point only by appropriately moving the X-Y stage. Hence, if the evaluation system having the electrical resistance measuring means is used in a manufacturing line for a liquid crystal display or the like, productivity is significantly improved, allowing further proper quality control of the oxide semiconductor thin film.

An apparatus configuration having the electrical resistance measuring means is described with reference to FIG. 16. FIG. 16 illustrates an apparatus including the apparatus that measures and evaluates the change in reflectance and the electrical resistivity based on the above-described μ-PCD method, and an electrical resistance measuring means 30 added to the apparatus of FIG. 13. The electrical resistance measuring means 30 may not be necessarily provided. Although the electrical resistance measuring means 30 may not be mounted at a limited position, but is desirably mounted such that the electrical resistivity can be measured by the electrical resistance measuring means 30 at substantially the same point as the microwave photoconduction measurement point on the oxide semiconductor thin film by moving the X-Y stage 11 as described above. The electrical resistance measuring means 30 preferably includes an electrical resistivity measuring head 31 and an up-and-down means 32 for the electrical resistivity measuring head 31. The electrical resistivity of the sample 20 can be measured by the electrical resistance measuring means 30.

The electrical resistivity measuring head 31 is a means for measuring the electrical resistivity by a contact method. The electrical resistivity measuring head 31 has a resistance measuring terminal corresponding to the above-described resistance measuring means. The resistance measuring terminal exemplarily includes a measuring probe such as a double ring electrode, and a head including four needle electrodes arranged on a straight line. The electrical resistivity of the oxide semiconductor thin film can be determined through resistance measurement using the double ring electrode in accordance with JIS K6911, or resistance measurement by a four probe method in accordance with JIS K7194.

The up-and-down means 32 of the electrical resistivity measuring head 31 is an up-and-down mechanism that lowers the electrical resistivity measuring head to a desired position for measurement of the electrical resistivity of the sample 20. Any known electrical resistivity measuring apparatus can be used as a means for measuring the electrical resistivity. For example, the electrical resistivity can be evaluated by an electrical resistance measuring apparatus such as a probe head from JANDEL.

As described above, according to the evaluation method of the invention, superiority or inferiority of the electrical resistivity between samples each having the laminate can be simply evaluated. For example, as demonstrated in Example as described later, the electrical resistivity can be varied by varying a flow rate of silane in a mixed gas during formation of the protective film. Hence, a desired electrical resistivity can be given through optimization of a protective-film formation condition. At this time, it is important that if properties of the oxide semiconductor thin film itself are varied, electrical resistivity of the oxide semiconductor thin film is also varied. Hence, when superiority or inferiority of electrical resistivity between samples is evaluated, or the optimum formation condition of the protective film is determined by the method of the invention, a plurality of oxide semiconductor thin films are necessary to be prepared as a precondition, the oxide semiconductor thin films being formed at the same condition and subjected to the same heat treatment and thus being in substantially the same state. This makes it clear that an actual variation in electrical resistivity is caused by formation of the protective film; hence, the superiority or inferiority of electrical resistivity or the like can be accurately determined.

Using the evaluation method of the invention makes it possible to simply evaluate stress resistance of the oxide semiconductor thin film in a short time and at low cost during optimization of a TFT manufacturing process. Furthermore, using the evaluation method of the invention makes it possible to perform in-line evaluation of electrical properties of the oxide semiconductor thin film in a short time in a manufacturing line of a liquid crystal display or the like. Moreover, since the μ-PCD method allows noncontact evaluation, productivity such as a production yield can be improved, and quality control of the oxide semiconductor can be properly performed.

This application claims the benefit of priority of Japanese Patent Application No. 2014-136349 filed on Jul. 1, 2014, the entire contents of which are incorporated herein by reference.

EXAMPLES

Although the invention is now described in detail with Examples, the invention should not be limited thereto, and it will be appreciated that modifications or alterations thereof may be made within the scope without departing from the gist described before and later, all of which are included in the technical scope of the invention.

Example 1

In this Example, characteristics caused by stress occurring after positive-bias application were evaluated by directly measuring electrical resistivity of the oxide semiconductor thin film Specifically, a laminate sample for measurement of electrical resistivity was prepared as in (1) below, and TFT for measurement of TFT characteristics was manufactured as in (2) below. The sample of (1) is a laminate having the same sectional structure as that of the TFT of (2) in that a gate insulating film, an oxide semiconductor thin film, and a protective film are provided on a substrate.

(1) Preparation of Sample for Measurement of Electrical Resistivity

A $SiO_2$ insulating film 200 nm thick corresponding to a gate insulating film was formed on a glass substrate (EAGLE 2000 from Corning) having a diameter of 100 mm and a thickness of 0.7 mm. The insulating film was formed by a plasma CVD process with a carrier gas including a mixed gas of $SiH_4$ and $N_2O$, where $N_2O$ was 100 sccm, $SiH_4$ was 4 sccm, and $N_2$ was 36 sccm, deposition power of 300 W, and deposition temperature of 320° C.

Subsequently, the oxide semiconductor thin film was formed by a sputtering process. IGZO (In:Ga:Zn=1:1:1 (compositional ratio, atomic ratio)) was used for the oxide thin film. The apparatus used for the sputtering was "CS-200" from ULVAC, Inc., and the sputtering condition was as follows.

Substrate temperature: Room temperature
Gas pressure: 1 mTorr
Oxygen partial pressure (volume ratio): $O_2/(Ar+O_2)$=4%
Thickness: 40 nm The oxide semiconductor thin film was formed in the above manner, and was then patterned by photolithography and wet etching. "ITO-07N" from Kanto Chemical Co., Ltd was used as the etchant solution.

The oxide semiconductor thin film was patterned in this way, and was then subjected to pre-annealing to improve film quality. The pre-annealing was performed for 60 min at 350° C. under atmospheric pressure in 100% oxygen atmosphere.

Subsequently, an etch stop layer for protecting the oxide semiconductor thin film was formed. Specifically, $SiO_2$ 100 nm thick was deposited by a plasma CVD process. The gas used for the deposition was a mixed gas of $SiH_4/N_2O$, and a flow rate (sccm/sccm) of the mixed gas was varied in a range from 2/50 to 10/250, i.e., 2/50, 4/100, 6/150, 8/200, and 10/250. Deposition temperature was 230° C.

Subsequently, ohmic electrodes were formed. Specifically, pure Mo was deposited 100 nm in thickness by a DC sputtering process, and was then patterned.

Finally, a stacked film 400 nm thick in total including $SiO_2$ 200 nm thick and SiN 200 nm thick was formed as a passivation film for blocking the external atmosphere. The $SiO_2$ and SiN were each deposited by a plasma CVD process using "PD-220NL" from Samco Inc. The $SiO_2$ film was formed using a mixed gas of $N_2O$ and $SiH_4$. The SiN film was formed using a mixed gas of $SiH_4$, $N_2$, and $NH_3$. In each case, deposition power was 100 W and deposition temperature was 150° C.

Subsequently, a connection contact hole for measuring electrical resistance was formed in the protective film by photolithography and dry etching, and thus electrical resistivity measuring samples were produced.

The samples were subjected to measurement of sheet resistance by applying a voltage between the electrodes. Specifically, a semiconductor parameter analyzer "4156C" from National Instruments Corporation was used to measure current-voltage characteristics.

(2) Preparation of Sample for TFT Measurement

A Mo thin film 100 nm thick was formed as a gate electrode on a glass substrate (EAGLE 2000 from Corning) having a diameter of 100 mm and a thickness of 0.7 mm. The gate electrode was formed by a DC sputtering process using a pure Mo sputtering target. The sputtering condition was as follows. Substrate temperature was room temperature, and gas pressure was 2 mTorr.

A $SiO_2$ gate insulating film 200 nm thick and an oxide semiconductor thin film 40 nm thick were sequentially formed as in (1) on the gate electrode produced in such a way and were patterned, and were then subjected to pre-annealing. Subsequently, an etch stop layer and a passivation film were formed as in (1). A Mo thin film was formed for source and drain electrodes in place of the ohmic electrodes described in (1). The formation method and the patterning method of the pure Mo film were the same as those for the gate electrode as described above. Channel length and channel width of the TFT were adjusted to 10 µm and 200 µm, respectively.

The source and drain electrodes were thus formed, and then the protective film for protecting the oxide semiconductor thin film was formed as in (1), and the contact hole was formed to produce TFT measurement samples.

The TFTs were thus produced, and were subjected to investigation of TFT characteristics in the following manner. In detail, (I) transistor characteristics: I-V characteristics, specifically (i) an absolute value of a threshold voltage and (ii) an initial repetition characteristic were investigated. In addition, (II) a variation $\Delta V_{th}$ in threshold voltage $V_{th}$ was investigated when a positive-bias stress application test was performed.

(I) Measurement of Transistor Characteristics

The transistor characteristics were measured with a semiconductor parameter analyzer "4156C" from National Instruments Corporation. Detailed measurement conditions were as follows.

Source voltage: 0.1 V
Drain voltage: 10 V
Gate voltage: −30 to 30 V (measurement interval: 0.25 V)

From results of the measurement, (i) an absolute value of a threshold voltage in a static characteristic was determined. In addition, (ii) for evaluation of the initial repetition characteristic, transistor characteristics evaluation tests were performed three times, and a threshold shift amount in repetitive sweep was calculated from a difference between an absolute value of the threshold voltage in the first test and an absolute value of the threshold voltage in the third test.

(II) Evaluation of $\Delta V_{th}$ as Stress Resistance.

In this Example, a stress application test was performed while a positive bias is applied to the gate electrode to simulate stress environment during actual panel drive. A stress application condition was as follows.

Gate voltage: +20 V
Substrate temperature: 60° C.
Stress application time: Two hours The threshold voltage roughly corresponds to a value of a gate voltage when a transistor shifts from an off state, i.e., a state of low drain current, to an on state, i.e., a state of high drain current. In this Example, a voltage at a drain current around 1 nA between an on current and an off current was defined as threshold voltage $V_{th}$, and the amount of change in threshold voltage $\Delta V_{th}$ between before and after stress application was measured. The smaller the $\Delta V_{th}$, the better the stress resistance.

Figure 8:
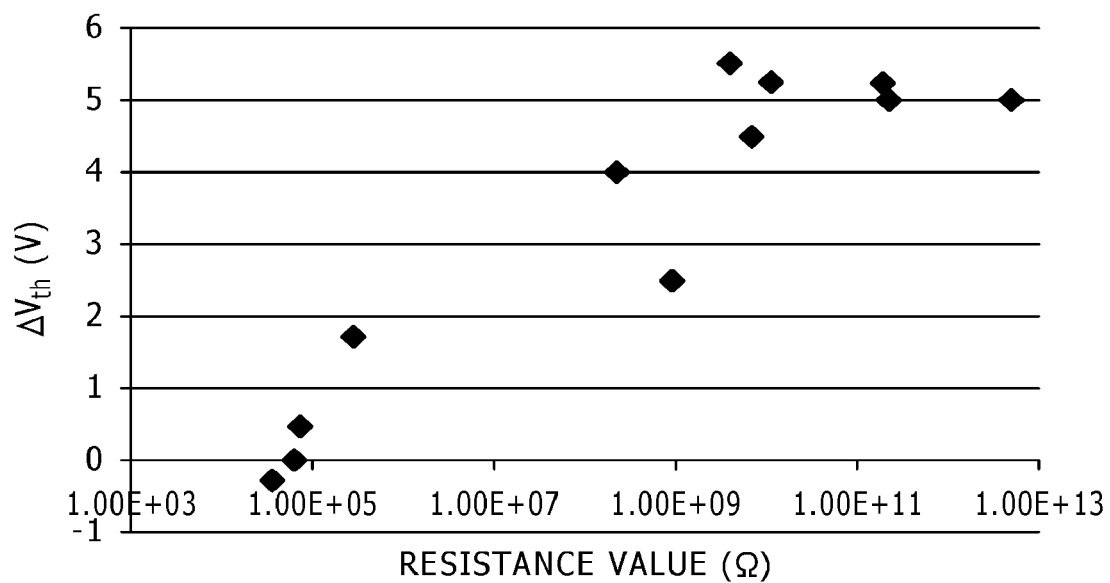
FIG. 8 is a graph illustrating a relationship between $\Delta V_{th}$ and electrical resistance in Example 1.

FIG. 8 illustrates a relationship between $\Delta V_{th}$ (V) (ordinate) and electrical resistance (Ω) between the electrodes (abscissa) in the positive bias stress application test. FIG. 8 reveals that behaviors of $\Delta V_{th}$ and electrical resistivity are substantially equivalent to each other.

Figure 9:
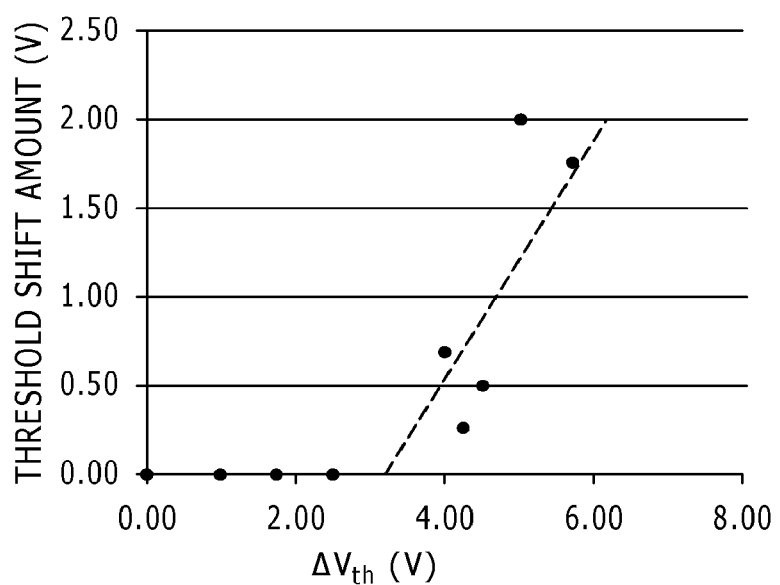
FIG. 9 is a graph illustrating a relationship between $\Delta V_{th}$ and a threshold shift amount in repetitive sweep in Example 1.
Figure 10:
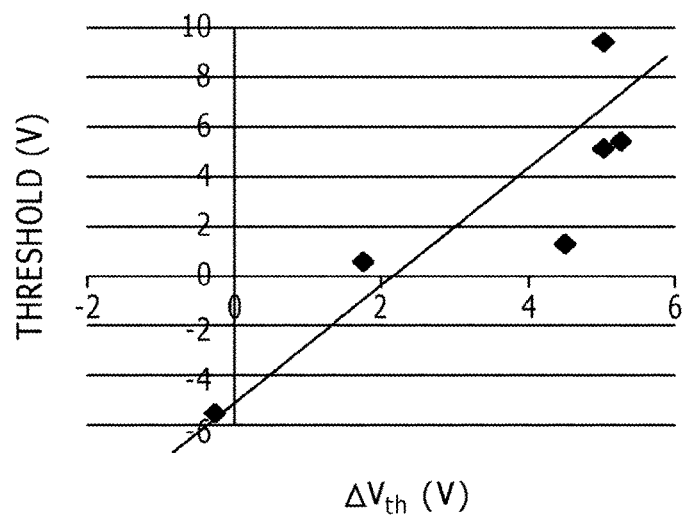
FIG. 10 is a graph illustrating a relationship between $\Delta V_{th}$ and an absolute value of a threshold voltage in a static characteristic in Example 1.

FIG. 9 illustrates a relationship between the threshold shift amount (V) in repetitive sweep (ordinate) and $\Delta V_{th}$ (V) measured by the method of (II) (abscissa). FIG. 10 illustrates a relationship between the absolute value (V) of the threshold voltage in the static characteristic (ordinate) and $\Delta V_{th}$ (V) (abscissa). Such drawings reveal that $\Delta V_{th}$, the absolute value of the threshold voltage in the static characteristic, and the threshold shift amount in repetitive sweep have a good correlation with one another.

The results of FIGS. 8 to 10 prove that use of the evaluation method based on electrical resistivity of the invention allows the above-described items caused by stress of positive-bias application to be indirectly and accurately evaluated.

Example 2

In this Example, characteristics caused by stress after positive-bias application were evaluated by indirectly measuring electrical resistivity of the oxide semiconductor thin film by the µ-PCD method.

Specifically, various characteristics were evaluated using the samples manufactured in Example 1. Table 1 indicates results of the evaluation. TFTs 1 to 5 were produced by forming ESLs while a flow rate (sccm/sccm) of $SiH_4/N_2O$ was varied in a range including 2/50, 4/100, 6/150, 8/200, and 10/250, and $\Delta V_{th}$ of each TFT after the lapse of time of two hours is as follows.

TFT-1: 5V
TFT-2: 5.25 V
TFT-3: 4.5 V
TFT-4: 1.75 V
TFT-5: -0.25 V

TABLE 1

| Sample No | $SiH_4/N_2O$ flow rate (sccm) | Deposition rate (nm/min) | Mobility ($cm^2$/Vs) | Subthreshold swing (V/dec) | $V_{th}$ (V) |
|---|---|---|---|---|---|
| TFT-1 | 2/50 | 10.3 | 7.2 | 0.27 | 9.25 |
| TFT-2 | 4/100 | 27.4 | 8.5 | 0.48 | 5.00 |
| TFT-3 | 6/150 | 41.8 | 7.8 | 0.34 | 1.25 |

TABLE 1-continued

| Sample No | SiH$_4$/N$_2$O flow rate (sccm) | Deposition rate (nm/min) | Mobility (cm$^2$/Vs) | Subthreshold swing (V/dec) | V$_{th}$ (V) |
|---|---|---|---|---|---|
| TFT-4 | 8/200 | 56.8 | 6.2 | 0.19 | 0.50 |
| TFT-5 | 10/250 | 70.0 | 12.3 | 0.28 | −5.50 |

Furthermore, the samples were used to measure "parameter corresponding to slow decay observed after irradiation of excitation light" in the μ-PCD method. Specifically, an apparatus having a configuration as illustrated in FIG. 1 or 16 of PTL 2 as described before, specifically LTA-1820SP from Kobelco Research Institute, Inc., was used to perform the μ-PCD method at the following condition, and temporal change in reflectance was measured.

Laser wavelength: 349 nm ultraviolet light
Pulse width: 15 ns
Pulse energy: 1 μJ/pulse
Beam diameter: 1.5 mmφ
Number of pulses for each measurement: 64 shots
Apparatus: LTA-1820SP from Kobelco Research Institute, Inc.

A "B" value obtained when a relationship between reflectance and measurement time was represented by Formula (1) was calculated as "slope" to calculate a parameter that is calculated based on the relationship between reflectance and measurement time, the relationship being obtained by the μ-PCD method, i.e., to calculate "parameter corresponding to slow decay" defined in the invention. At this time, a slope within such a measurement time span was calculated as "−B" value on the assumption that measurement time x was 0.3 to 1.0 μs.

$$y = Ax^{-B} \text{ (x: measurement time, y: reflectance)} \quad \text{formula (1)}$$

Figure 11:
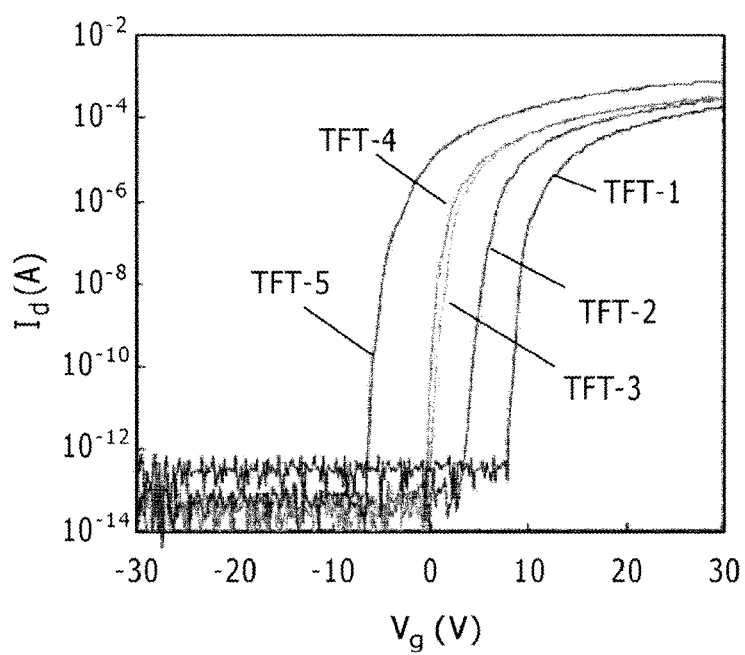
FIG. 11 is a graph illustrating a result of I-V characteristics in Example 2.

FIG. 11 illustrates I-V characteristics of each of the TFTs 1 to 5. FIG. 11 reveals that TFT operation is varied by a flow ratio of SiH$_4$/N$_2$O.

Figure 12:
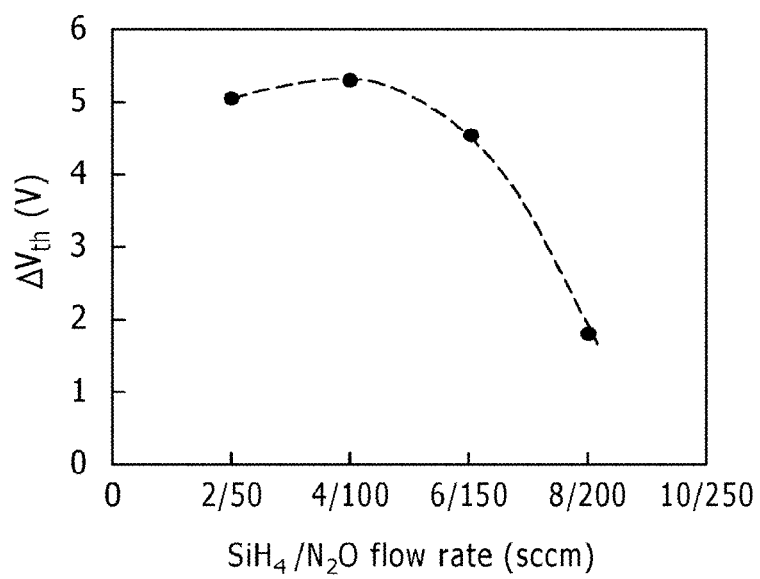
FIG. 12 is a graph illustrating a relationship between a flow ratio of $SiH_4/N_2O$ and $\Delta V_{th}$ in Example 2.

FIG. 12 is a graph illustrating a relationship between the flow ratio of SiH$_4$/N$_2$O and ΔV$_{th}$. FIG. 12 reveals that increasing the flow rate of SiH$_4$/N$_2$O decreases ΔV$_{th}$ in the positive-bias stress application test.

Figure 13A:
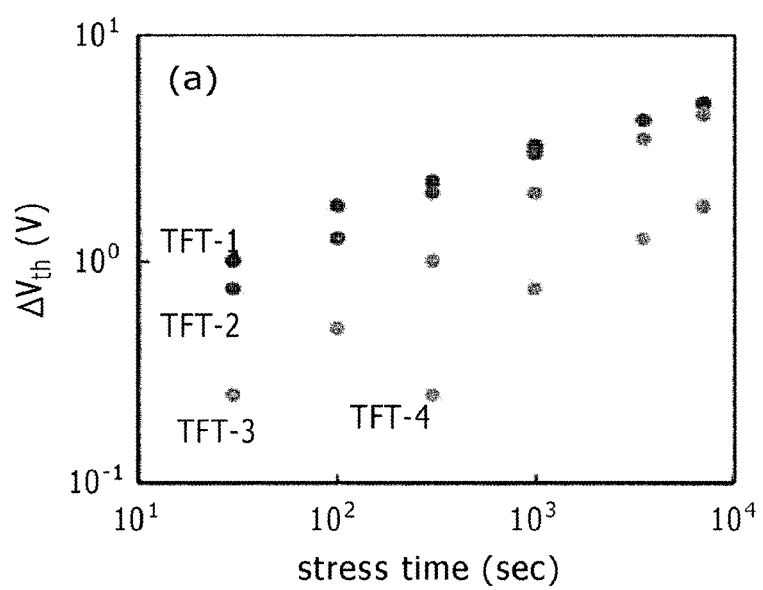
FIG. 13A is a graph illustrating a relationship between stress application time and $\Delta V_{th}$ in Example 2.

FIG. 13A is a double logarithmic chart, in which a value of ΔV$_{th}$ is plotted with respect to stress application time for each TFT. FIG. 13A reveals that each TFT demonstrates good linearity, and ΔV$_{th}$ has a relationship described by power-law with stress application time.

Based on such results, temporal variation of threshold is fitted in a relationship of A×t$^n$, and each parameter was plotted with respect to the flow rate of SiH$_4$/N$_2$O.

Figure 13B:
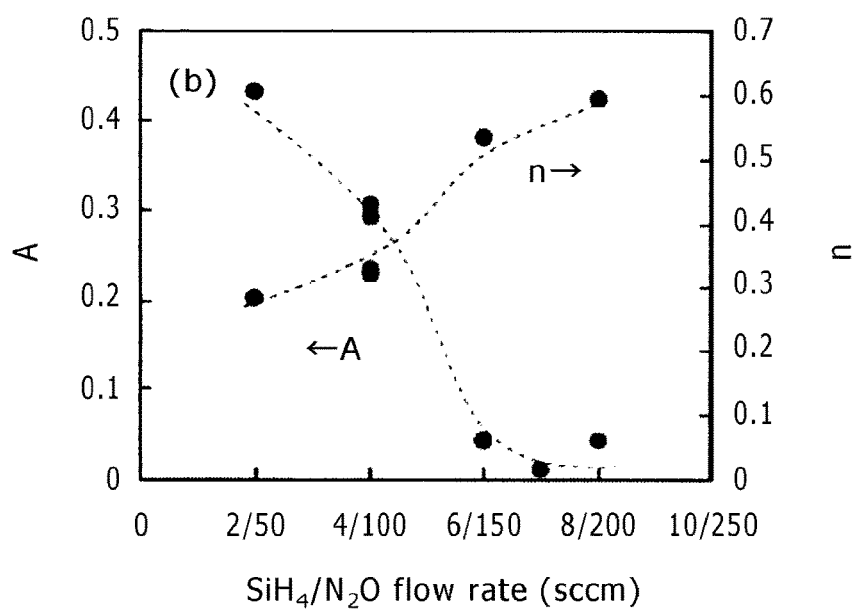
FIG. 13B is a graph illustrating a relationship between a flow ratio of $SiH_4/N_2O$ and each of an A value and an n value defining a slope B in Example 2.

FIG. 13B indicates results of such plotting. Although such A determining an initial value decreased with an increase in flow rate of SiH$_4$, the value of n was changed from 0.25, i.e., a flow rate of SiH$_4$≈2 sccm /N$_2$O to 0.5, i.e., a flow rate of SiH$_4$≈6 sccm /N$_2$O. With the behavior where n has a value of around 0.25 in this way, Saito et al. have noted that hydrogen existing in an interface between the oxide semiconductor thin film, or IGZO in this Example, and the protective film, or ESL in this Example, is released from a bond with the interface and is diffused away from the interface, thereby a trap level is formed in the interface (Paper title: S. Nakano, N. Saito, K. Miura, T. Sakano, T. Ueda, K. Sugi, H. Yamaguchi, I. Amemiya, M. Hiramatsu, A. Ishida, K. Kanamaru, and M. Sawada, IDW' 11, 1271 (2011)). The results of FIG. 13B therefore indicate that interface states between ESL and IGZO decrease by increasing the flow ratio of SiH$_4$/N$_2$O.

Figure 14:
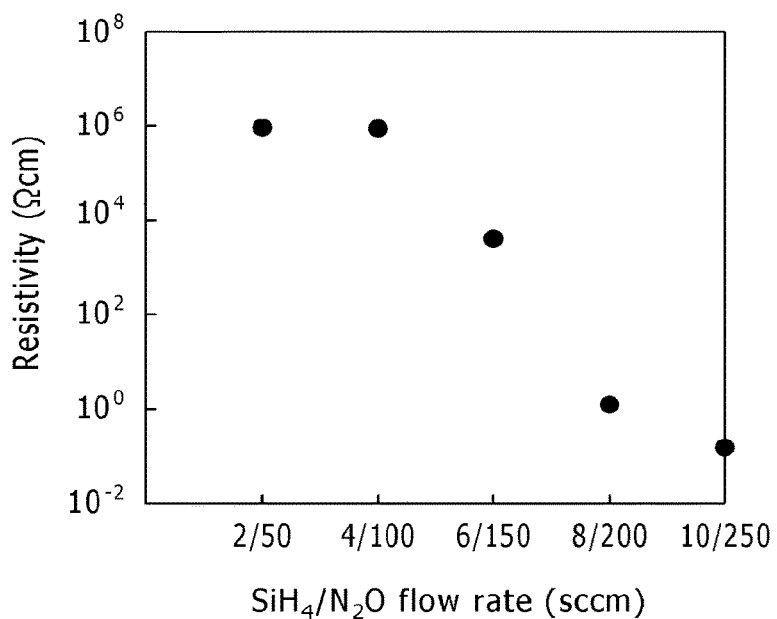
FIG. 14 is a graph illustrating a relationship between a flow ratio of $SiH_4/N_2O$ and sheet resistance in Example 2.

FIG. 14 illustrates a relationship between sheet resistance and a flow rate of SiH$_4$/N$_2$O. FIG. 14 reveals that the sheet resistance decreases with an increase in flow rate of SiH$_4$. Considering this result together with the result of FIG. 15 reveals that ΔV$_{th}$ correlates with the sheet resistance. Although not shown, capacitance—voltage (CV) measurement has been performed using a MOS diode, and results of the CV measurement reveal that each sample has a donor density of about 1×10$^{18}$ cm$^{-3}$. A specific resistance of an a-IGZO film under the same condition is estimated to be 2.7 Ω·cm from a Hall effect measurement result of thick IGZO, but the above-described sheet resistance is larger than a value expected from such an estimation result. It is therefore strongly suggested that the above-described drastic increase in sheet resistance is caused by band bending due to the increased interface states.

The threshold voltage in the repetitive sweep characteristic or the static characteristic is found to have a good correlation with ΔV$_{th}$ in the positive-bias stress application test as depicted in FIGS. 9 and 10. This result strongly suggests that the threshold voltage in the repetitive sweep characteristic or the static characteristic is caused by the interface states at the interface between ESL and IGZO as with the ΔV$_{th}$. Although the cause of the increase in the interface states is not clear in detail, plasma damage during ESL formation is estimated to be a cause of formation of the interface states in light of the fact that deposition time for ESL formation is greatly different.

Figure 15:
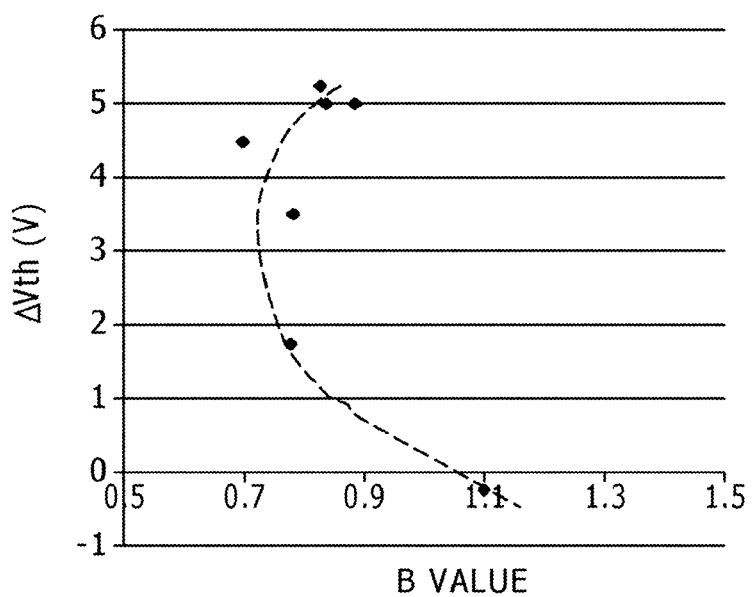
FIG. 15 is a graph illustrating a relationship between $V_{th}$ and the slope B value in Example 2.

FIG. 15 illustrates a relationship between ΔV$_{th}$ (V) obtained by the method of Example 1 and the B value obtained by the μ-PCD method. FIG. 15 reveals that ΔV$_{th}$ and the B value draw a U curve, indicating a correlation therebetween. In detail, it is found that when ΔV$_{th}$ is equal to or smaller than the apex ΔV$_{th}$≈3.5 V of the U curve, the B value as the absolute value becomes larger with smaller ΔV$_{th}$. FIG. 15 further reveals that the B value is affected by a rate of silane amount during formation of the protective film.

The results of FIGS. 12, 14, and 15 reveal that since the B value is useful as an index of each of sheet resistance and ΔV$_{th}$, use of the B value resultantly allows the sheet resistance of the oxide semiconductor thin film to be evaluated.

Furthermore, a basic experiment of the inventors has taught that when the B value as the absolute value is maximized, ΔV$_{th}$ is minimized, and good TFT characteristics are exhibited. Consequently, the formation condition of the protective film is properly adjusted such that the B value is maximized, thereby good TFT characteristics are expected to be exhibited.

LIST OF REFERENCE SIGNS

1 Excitation light irradiation means
3 Microwave irradiation means
4 Directional coupler
4a Phase regulator
5 Magic T
6a First waveguide
6b Second waveguide
6c Small opening
6d, 6e Opening
7 Reflected-microwave intensity detection means
8 Signal processor
9 Evaluation means
10 Stage controller
11 X-Y stage
12 Optical-path change means 16a Output adjustment power monitor
16b Output adjustment means
20 Sample
20a Substrate
20b Oxide semiconductor thin film
21 Excitation light irradiation region
30 Electrical resistivity measurement means
31 Electrical resistivity measuring head
32 Up-and-down means
33 Measured-value transmission line
42 Gate electrode
43 Gate insulating film
45 Etch stop layer
46a Source electrode
46b Drain electrode
47 Passivation film
48 Contact hole
49 Evaluation element
50 Display
51 Mother glass

The invention claimed is:

1. A quality evaluation method of a laminate including a protective film on a surface of an oxide semiconductor thin film,
wherein a defect caused by an interface state between the oxide semiconductor thin film and the protective film is evaluated by measuring a sheet resistance or a specific resistance of the oxide semiconductor thin film by a contact method or a noncontact method,
wherein the defect caused by the interface state is one of the following (1) to (3)
(1) threshold voltage $V_{th}$ of a thin film transistor,
(2) a difference in threshold voltage $\Delta V_{th}$ between before and after application of a positive bias when the positive bias is applied to the thin film transistor, and
(3) a difference between a threshold voltage at first measurement and a threshold voltage after multiple times of measurement when the threshold voltage of the thin film transistor is measured multiple times.

2. The evaluation method according to claim 1, wherein the oxide semiconductor thin film contains at least one element selected from the group consisting of In, Ga, Zn, and Sn.

3. The evaluation method according to claim 1, wherein the oxide semiconductor thin film is provided on a surface of an insulating film formed on a substrate.

4. The evaluation method according to claim 1, wherein a defect caused by the interface state is evaluated using a laminate having a first electrode and a second electrode in contact with two respective sides of the protective film.

5. The evaluation method according to claim 1, wherein when the defect caused by the interface state is measured by the contact method, electrodes are provided on the surface of the oxide semiconductor thin film, and the defect is evaluated based on one of a measured current value and a measured voltage.

6. A quality evaluation method of a laminate for evaluating a thin film transistor, wherein when a defect caused by an interface state between the oxide semiconductor thin film and the protective film is measured by a noncontact method based on an electronic state of the oxide semiconductor thin film of the laminate comprising a protective film thereon, the measurement includes;
(i) irradiating the laminate with excitation light and a microwave, measuring maximum of a reflected wave of the microwave from the oxide semiconductor thin film, the maximum being varied by irradiation of the excitation light, and then stopping irradiation of the excitation light, and measuring temporal change in reflectance of the reflected wave of the microwave from the oxide semiconductor thin film after stopping irradiation of the excitation light, and
(ii) calculating a parameter corresponding to slow decay, the slow decay being, observed after stopping irradiation of the excitation light, from the temporal change in reflectance to evaluate the electronic state of the oxide semiconductor thin film.

7. The evaluation method according to claim 6, wherein in (ii), a parameter corresponding to slow decay observed at 0.1 to 10 μs after stopping irradiation of the excitation light is calculated from the temporal change in reflectance to evaluate the electronic state of the oxide semiconductor thin film.

8. A quality control method of an oxide semiconductor thin film, wherein the evaluation method according to claim 6 is applied to at least one step of a semiconductor manufacturing process.

9. The evaluation method according to claim 6, wherein the electronic state of the oxide semiconductor thin film is measured based on electrical resistivity of the oxide semiconductor thin film.

10. The evaluation method according to claim 6, wherein the electrical resistivity is one of sheet resistance and specific resistance.

11. The evaluation method according to claim 6, wherein the defect caused by the interface state is one of the following (1) to (3)
(1) a threshold voltage $V_{th}$ of a thin film transistor,
(2) a difference in threshold voltage $\Delta V_{th}$, between before and after application of a positive bias when the positive bias is applied to the thin film transistor, and
(3) a difference between a threshold voltage at first measurement and a threshold voltage after multiple times of measurement when the threshold voltage of the thin film transistor is measured multiple times.

12. The evaluation method according to claim 6, wherein the oxide semiconductor thin film contains at least one element selected from the group consisting of In, Ga, Zn, and Sn.

13. The evaluation method according to claim 6, wherein the oxide semiconductor thin film is provided on a surface of an insulating film formed on a substrate.

* * * * *